(12) United States Patent
Lee et al.

(10) Patent No.: US 8,697,537 B2
(45) Date of Patent: Apr. 15, 2014

(54) METHOD OF PATTERNING FOR A SEMICONDUCTOR DEVICE

(75) Inventors: Chia Ying Lee, New Taipei (TW); Chih-Yuan Ting, Taipei (TW); Jyu-Horng Shieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 136 days.

(21) Appl. No.: 13/364,119

(22) Filed: Feb. 1, 2012

(65) Prior Publication Data
US 2013/0196481 A1 Aug. 1, 2013

(51) Int. Cl.
*H01L 21/76* (2006.01)
(52) U.S. Cl.
USPC .......................................... 438/427; 438/424
(58) Field of Classification Search
USPC .................................................. 438/424, 427
See application file for complete search history.

(56) References Cited

U.S. PATENT DOCUMENTS

| | | | | |
|---|---|---|---|---|
| 5,328,810 A | * | 7/1994 | Lowrey et al. | 430/313 |
| 6,063,688 A | * | 5/2000 | Doyle et al. | 438/424 |
| 7,071,074 B2 | * | 7/2006 | Schmidt et al. | 438/427 |
| 7,439,153 B2 | * | 10/2008 | Tsuboi et al. | 438/404 |
| 7,479,366 B2 | * | 1/2009 | Hagiwara | 430/312 |
| 7,737,016 B2 | * | 6/2010 | Blatchford et al. | 438/587 |
| 7,790,360 B2 | * | 9/2010 | Alapati et al. | 430/316 |
| 8,404,581 B2 | * | 3/2013 | Tsai et al. | 438/637 |
| 2003/0148587 A1 | * | 8/2003 | Suzuki et al. | 438/424 |
| 2005/0142497 A1 | * | 6/2005 | Ryou et al. | 430/311 |
| 2005/0239257 A1 | * | 10/2005 | Sato et al. | 438/296 |
| 2006/0216905 A1 | * | 9/2006 | Schmidt et al. | 438/427 |
| 2007/0009838 A1 | * | 1/2007 | You et al. | 430/313 |
| 2007/0128526 A1 | * | 6/2007 | Wallace et al. | 430/5 |
| 2007/0148984 A1 | * | 6/2007 | Abatchev et al. | 438/725 |
| 2007/0161251 A1 | * | 7/2007 | Tran et al. | 438/725 |
| 2007/0172770 A1 | * | 7/2007 | Witters et al. | 430/313 |
| 2007/0231748 A1 | * | 10/2007 | Sivakumar et al. | 430/313 |
| 2007/0238053 A1 | * | 10/2007 | Hashimoto | 430/313 |
| 2009/0014811 A1 | * | 1/2009 | Becker et al. | 257/390 |
| 2009/0035902 A1 | * | 2/2009 | Xu et al. | 438/259 |
| 2009/0065892 A1 | * | 3/2009 | Kim | 257/510 |
| 2009/0125870 A1 | * | 5/2009 | Aton et al. | 716/21 |
| 2010/0176479 A1 | * | 7/2010 | Postnikov et al. | 257/499 |
| 2011/0156149 A1 | * | 6/2011 | Wang et al. | 257/368 |
| 2011/0193202 A1 | * | 8/2011 | Yu et al. | 257/632 |
| 2012/0091554 A1 | * | 4/2012 | Lee | 257/510 |
| 2012/0205746 A1 | * | 8/2012 | Wang | 257/368 |
| 2013/0157462 A1 | * | 6/2013 | Lee et al. | 438/685 |

OTHER PUBLICATIONS

Chia Ying Lee, Chih-Yuan Ting, Jyu-Horng Shieh, Minghsing Tsai and Syun-Ming Jang; "Method of Forming Pattern for Semiconductor Device;" U.S. Appl. No. 13/328,680, filed Dec. 16, 2011; 25 Pages.

* cited by examiner

*Primary Examiner* — Yu-Hsi D Sun
*Assistant Examiner* — Grant Withers
(74) *Attorney, Agent, or Firm* — Haynes and Boone, LLP

(57) ABSTRACT

A method that includes forming a masking element on a semiconductor substrate and overlying a defined space. A first feature and a second feature are each formed on the semiconductor substrate. The space interposes the first and second features and extends from a first end of the first feature to a first end of the second feature. A third feature is then formed adjacent and substantially parallel the first and second features. The third feature extends at least from the first end of the first feature to the first end of the second feature.

20 Claims, 8 Drawing Sheets

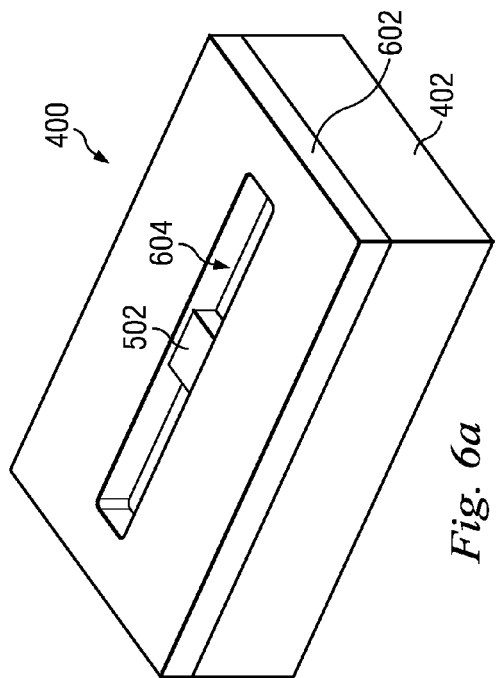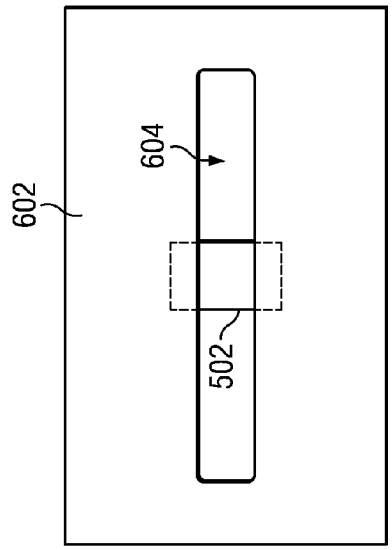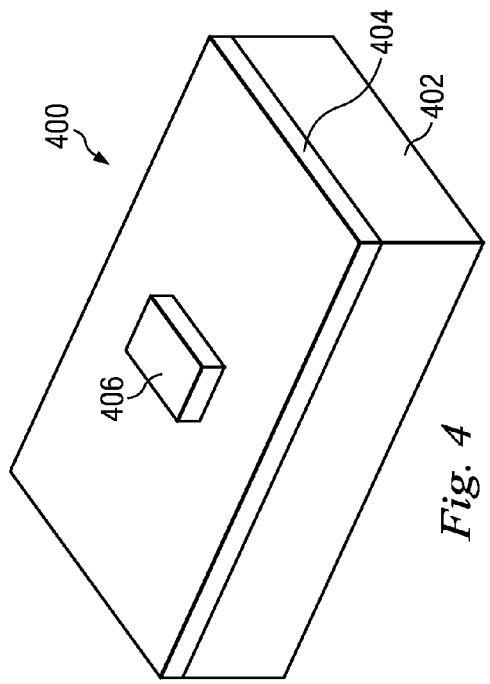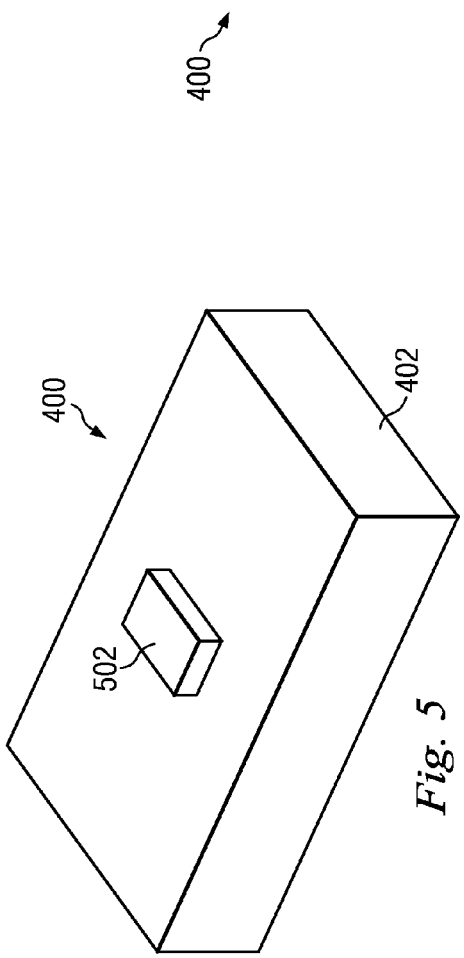

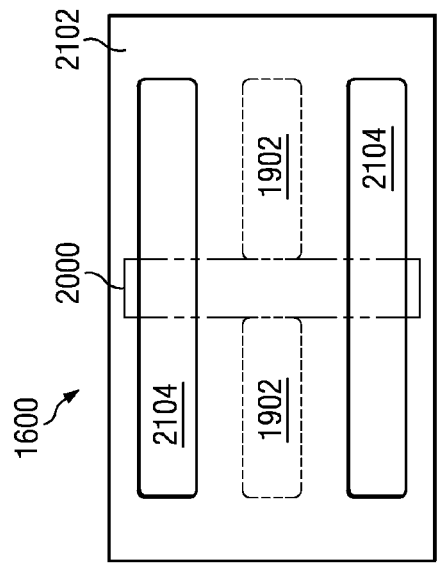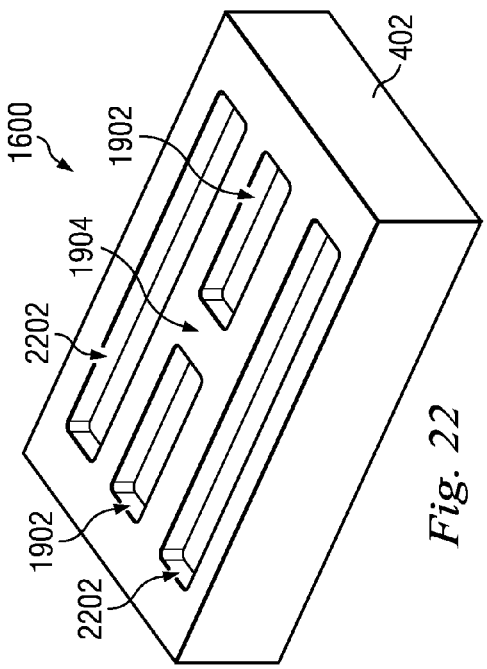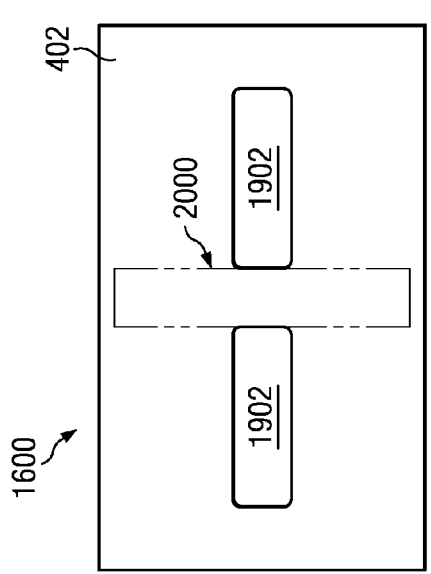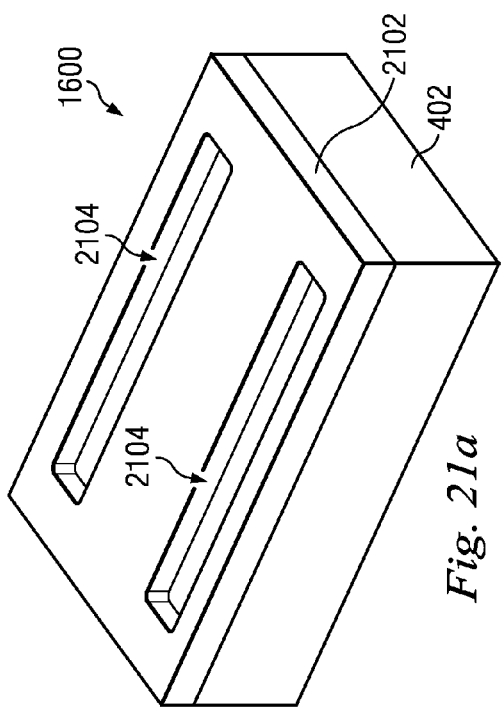

METHOD OF PATTERNING FOR A SEMICONDUCTOR DEVICE

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods and materials have been developed to realize the desire for smaller feature sizes.

Photoresists are photosensitive materials used to transfer images to a substrate. A coating layer of photoresist is positioned on the substrate and then exposed (or irradiated) through lithography methods to provide a masking element feature on the substrate. One challenge of producing smaller feature sizes is that the masking element feature may be so small as to suffer collapse during processing and/or handling that causes loss of pattern fidelity.

Thus, what is needed is a method and device to provide small pitch spacing between features while reducing the risk of collapse of features used to define the spacing.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4-9 are cross-sectional views of an embodiment of a semiconductor device fabricated corresponding to steps of the method of FIG. 3.

FIGS. 16-22 are cross-sectional views of an embodiment of a semiconductor device fabricated corresponding to steps of the method of FIG. 15.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. For example, though described herein as a photolithography method configured to fabricate semiconductor devices, any photolithography method or system may benefit from the disclosure including, for example, for TFT-LCD fabrication, and/or other photolithography processes known in the art. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
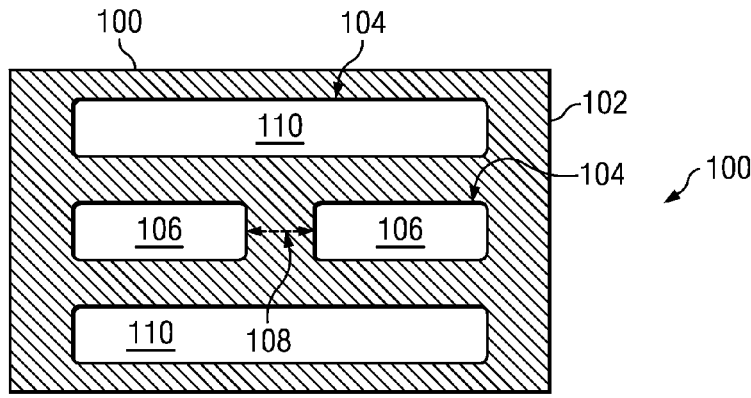
FIG. 1 is top-view of an embodiment of a pattern that may be formed using one or more aspects of the present disclosure.

Illustrated in FIG. 1 is a pattern 100 corresponding to one or more elements of a semiconductor device. The pattern 100 includes a substrate 102 and a plurality of features 104 formed thereon. The features 104 include a first and second feature 106 having an end-to-end space 108 disposed there between. In an embodiment, the first and second features 106 are interconnect features such as, for example, vias, lines, damascene structures, and/or other suitable features. For example, the first and second features 106 may be an interconnect feature such as a trench that is used to form a conductive interconnect feature such as a via, damascene structure, line, and/or other suitable features. In an embodiment, the first and second features 106 are isolation features such as, for example, shallow trench isolation (STI) structures.

The features 104 further include a third and fourth feature 110. In an embodiment, the third and fourth features 110 are interconnect features such as, for example, trenches (or openings) to form vias, lines, damascene structures, and/or other suitable features. In an embodiment, the third and fourth features 110 are isolation features such as, for example, shallow trench isolation (STI) structures. It is noted that the third and fourth features 110 do not require an end-to-end spacing, such as end-to-end spacing 108. The features 104 may all be associated with the same structure, for example, in an embodiment all the features 104 are trench structures. The features 104 may be formed on the same layer of a device.

The pattern 100 may be associated with a semiconductor device such as a complementary metal-oxide-semiconductor field-effect transistor (CMOSFET), imaging sensor, memory cell, and/or capacitive element.

Figure 2:
FIG. 2 is a flow chart of an embodiment of a method of patterning a semiconductor device according to one or more aspects of the present disclosure.
Figure 3:
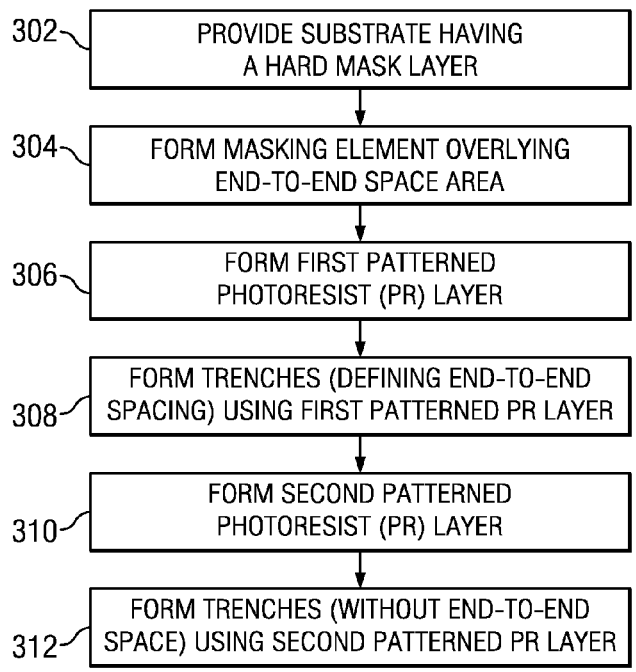
FIG. 3 is a flow chart of an embodiment of the method of FIG. 2.
Figure 8B:
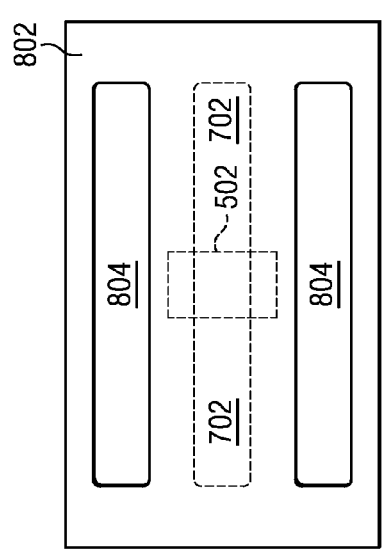
Figure 10:
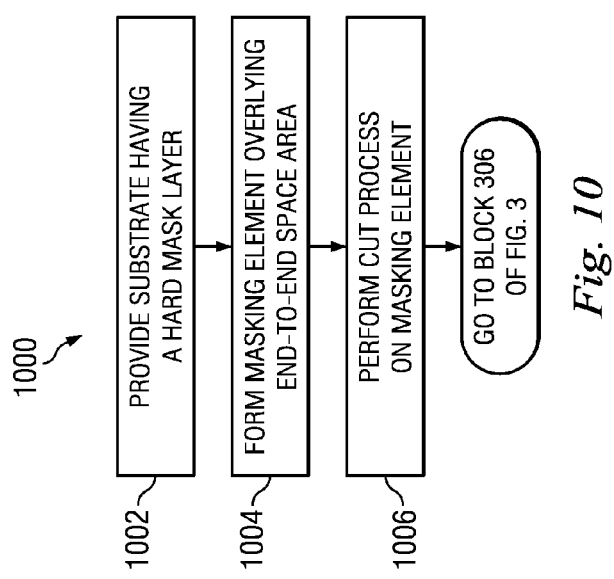
FIG. 10 is a flow chart of another embodiment of the method of FIG. 2.
Figure 15:
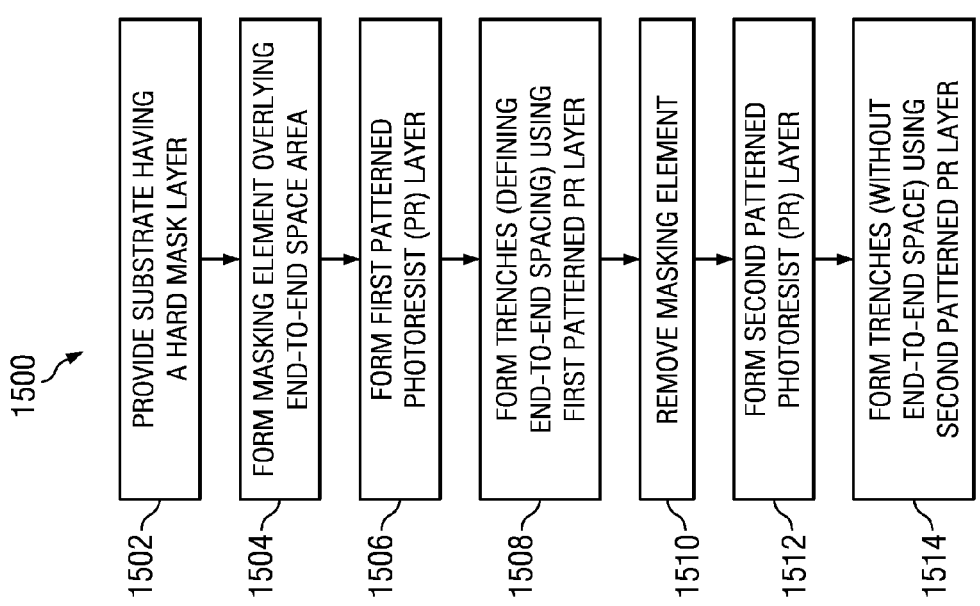
FIG. 15 is a flow chart of another embodiment of the method of FIG. 2.

Referring now to FIG. 2, illustrated is a method 200 for patterning a target layer. The method 200 may be used to fabricate the pattern 100, described above with reference to FIG. 1. FIGS. 3, 10, and 15 provide further details of embodiments of the method 200 and are described in greater detail below.

The method 200 begins at block 202 where a masking element is provided. The masking element may be photoresist, hard mask material, and/or other suitable material. The masking element is positioned on and over a region providing an end-to-end spacing between adjacent features, for example, over the end-to-end spacing 108 described above with reference to FIG. 1. At least one dimension of the masking element may define a dimension of the end-to-end spacing (e.g., width). The masking element may be referred to as an "island" as it is constrained in dimensions to include the end-to-end spacing and/or surrounding regions.

The method 200 then proceeds to block 204 where features are formed on each end of the end-to-end space area defined in block 202. In an embodiment, the features are trench features. Forming the features may include forming a photosensitive layer, patterning the photosensitive layer to form a masking element, and forming the features in the exposed regions (e.g., not protected by the masking element(s)). In an embodiment, trenches are formed by etching the target layer or substrate as defined by the masking element(s). The masking elements used in forming the features may include the patterned sensitive layer and/or the masking element described above with reference to block 202. The etching may include dry etching, plasma etching, and/or other suitable etching processes.

The method 200 then proceeds to block 206 where additional features are formed on the substrate. Block 206 may be a separate and distinct process(es) from block 204. In an embodiment, the additional features are trench features. Forming the additional features may include forming a photosensitive layer, patterning the photosensitive layer to form a masking element, and forming the features in the exposed regions (e.g., not protected by the masking element(s)). In an embodiment, trenches are formed by etching the target layer or substrate as defined by the masking element(s). The etching may include dry etching, plasma etching, and/or other suitable etching processes. The additional features formed in block 206 may not require an end-to-end spacing, such as, for example, the features 110 of the pattern 100, described above with reference to FIG. 1.

The method 200 may be advantageous in that an end-to-end space region is provided between features. The end-to-end space may be provided without the requirement of forming a small masking element island to define the space, while etching both the first and second features (e.g., blocks 204 and 206) simultaneously. This is described in further detail with respect to the methods and devices below. Further, it is understood that the method 200 includes steps having features of a complementary metal-oxide-semiconductor (CMOS) technology process flow and thus, are only described briefly herein. Additional steps may be performed before, after, and/or during the method 200. Similarly, one may recognize other portions of a device that may benefit from the doping methods described herein.

Referring now to FIG. 3, illustrated is a method 300 of forming a pattern. The method 300 may be an embodiment of the method 200, described above with reference to FIG. 2. FIGS. 4-9 are views of an embodiment of a semiconductor device 400 fabricated according to the method 300 of FIG. 3.

It is also understood that parts of the semiconductor device 400 may be fabricated by complementary metal-oxide-semiconductor (CMOS) technology process flow, and thus some processes are only briefly described herein. Further, the semiconductor device 400 may include various other devices and features, such as additional transistors, bipolar junction transistors, resistors, capacitors, diodes, fuses, etc., but is simplified for a better understanding of the inventive concepts of the present disclosure. The semiconductor device 400 includes a plurality of semiconductor devices (e.g., transistors), which may be interconnected.

The method 300 begins at block 302 where a substrate is provided. In an embodiment, the substrate includes a silicon substrate (e.g., a wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate.

The substrate may include any number of layers disposed on a bulk semiconductor layer including conductive layers and insulating layers. The substrate may further include features formed on and/or in the substrate such as, doped regions, gate structures, isolation structures, active regions, and/or other suitable features typical in semiconductor devices and/or processes.

The substrate may include a target layer, which is to be patterned using the method 300. In an embodiment, the substrate itself is the "target layer" to be patterned (e.g., etched). Exemplary target layers include silicon, phosphosilicate glass (PSG) boro-silicate glass (BSG), fluorinated silicon glass (FGS), low-k dielectric materials, undoped silicate glass (USG), tetraethylorthosilicate (TEOS) oxide, other inter-layer (or inter-metal) dielectric (ILD) material; and/or other suitable materials. In an embodiment, the target layer is deposited by a chemical vapor deposition (CVD) processes such as plasma-enhanced CVD (PECVD) process, atomic layer deposition (ALD), spin-on coating, physical vapor deposition (PVD), and/or other suitable deposition techniques.

A hard mask layer is also formed on the substrate. A hard mask layer may include silicon oxide, silicon nitride, silicon oxynitride, silicon, titanium nitride, titanium, and/or other suitable hard mask material. The hard mask layer(s) may be formed by CVD, ALD, PVD, and/or other suitable deposition techniques. The hard mask layers may be used to form a pattern or transfer a pattern to the underlying target layer such as, providing a masking element.

Referring to the example of FIG. 4, a semiconductor device 400 that includes a substrate 402 having a hard mask layer 404 disposed thereon. The substrate 402 may include a semiconductor (e.g., silicon) substrate. In embodiments, the substrate 402 may include any plurality of layers of material including conductive layers and isolating layers. Additionally, the substrate 402 may include any number of features and/or device such as gate structures, interconnect structures, active regions, source/drain regions, isolation structures, p-wells, n-wells, and/or other features typical of semiconductor devices.

The method 300 then proceeds to block 304 where a masking element is formed on the substrate. The masking element overlies (e.g., protects) an end-to-end spacing area between features that are to be patterned on the substrate. The end-to-end spacing area may be a region between adjacent features, such as described above with reference to the end-to-end spacing 108 of FIG. 1. The masking element formed in block 304 may include hard mask material.

In an embodiment, the masking element is formed by forming a layer of photosensitive material (e.g., photoresist or resist) on the substrate, including on the hard mask layer. The layer of photoresist may be provided, for example, by spin-on coating followed by a bake process. The photoresist is patterned using suitable lithography techniques. In an embodiment, the lithography methods include exposing the photoresist to a pattern (using a suitable radiation source), developing the exposed photoresist, baking process(s), cleaning process (es) and/or other suitable CMOS processing methods.

Referring to the example of FIG. 4, a photoresist element 406 is disposed on the hard mask layer 404. The photoresist element may then be used to form a masking element of the underlying hard mask material. It is noted that the term masking element as described herein may refer to any patterned layer that is used to mask or protect a portion of the substrate or layer, while other portions of the respective substrate or layer are processed (for example, etched).

Subsequent to patterning the underlying hard mask material, the photoresist may be stripped from the substrate. Referring to the example of FIG. 5, the photoresist element 406 (FIG. 4) was used to pattern the hard mask layer 404 (FIG. 4) to form masking element 502. The masking element 502 may include hard mask material. Exemplary hard mask materials include silicon oxide, silicon nitride, silicon oxynitride, silicon, titanium nitride, titanium, and/or other suitable hard mask material. In an embodiment, the masking element 502 may be approximately 80 nanometers (nm) in width and/or approximately 120 nm in length. The width may define the spacing between features on the substrate such as the end-to-end spacing of trench feature 702 to trench feature 702, see FIG. 7. The length of the masking element 502 may define the distance between features (e.g., features 902, described below with reference to FIG. 9).

The etching of the hard mask material may include dry etching (e.g., reactive ion etching, sputtering, vapor phase etching), plasma etching, and/or other suitable etching processes.

After forming the masking element, the method 300 proceeds to block 306 where a patterned photoresist layer is formed. The photoresist layer of block 306 may be separate and distinct from any photoresist layer used to form the masking element described above with reference to block 304 (e.g., a different photomask may be used). The photoresist layer may be formed by spin-on coating followed by a bake process. The photoresist is patterned using suitable lithography techniques. In an embodiment, the lithography methods include exposing the photoresist to a pattern (using a suitable radiation source), developing the exposed photoresist, baking process(s), cleaning process(es) and/or other suitable CMOS processing methods. Referring to the example of FIGS. 6a and 6b, a patterned photoresist layer 602 is disposed on the substrate 402. The patterned photoresist layer 602 includes an opening 604.

The method 300 then proceeds to block 308 where features having an end-to-end spacing requirement are formed using the patterned photoresist layer of block 306 and/or the masking element of block 304. In an embodiment, the features formed are trench features (e.g., STI features, interconnect features) having an end-to-end spacing region between the trench features. The features may be substantially similar to the features 106 of the pattern 100, described above with reference to FIG. 1. The formation of the trench features may use dry etch, plasma etch, and/or other suitable techniques. The patterned photoresist layer may be stripped from the substrate after formation of the features.

Figure 7:
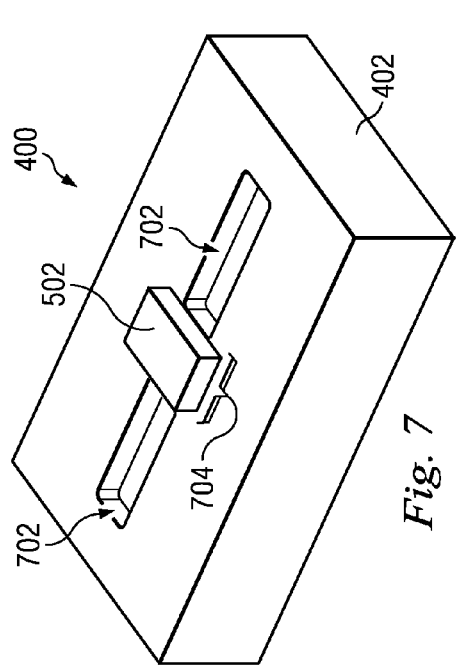
Figure 8A:
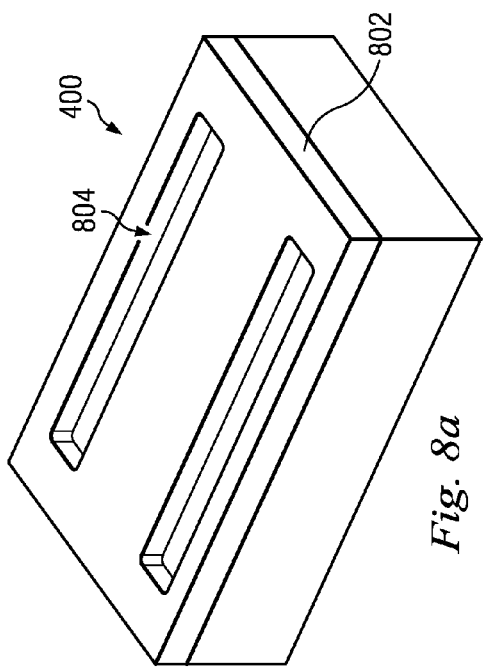

Referring to the example of FIG. 7, illustrated are features 702 (e.g., trench features) formed on and substrate 402. The trench features 702 may be etched using the photoresist 602 and masking element 502 (e.g., hard mask) as masking elements. The trench features 702 are spaced a distance from one another. Specifically, the region 704 interposes the trench features 702. The region 704 may be referred to as an end-to-end spacing. The region 704 may be substantially similar to the end-to-end spacing 108, described above with respect to the pattern 100 of FIG. 1. It is noted that the region 704 is protected during the etching process by the masking element 502.

After forming the features having an end-to-end spacing requirement, the method 300 proceeds to block 310 where another patterned photoresist layer is formed. The photoresist layer of block 310 may be separate and distinct from any photoresist layer used to form the masking element described above with reference to block 304 and different from that of block 306 (e.g., a different photomask may be used). The photoresist layer may be formed by spin-on coating followed by a bake process. The photoresist is patterned using suitable lithography techniques. In an embodiment, the lithography methods include exposing the photoresist to a pattern (using a suitable radiation source), developing the exposed photoresist, baking process(s), cleaning process(es) and/or other suitable CMOS processing methods. Referring to the example of FIGS. 8a and 8b, a patterned photoresist layer 802 is disposed on the substrate 402. The patterned photoresist layer 802 includes openings 804. The openings 804 may define features to formed on/in the substrate 402 (e.g., trenches 902, described below).

Figure 9:
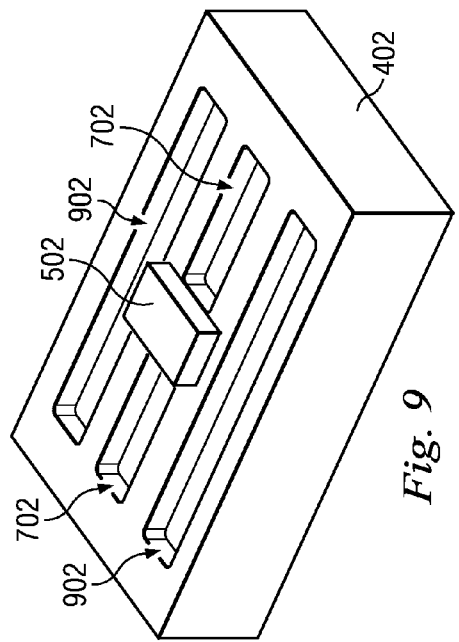

The method 300 then proceeds to block 312 where features (e.g., not having an end-to-end spacing requirement) are formed using the patterned photoresist layer of block 310. In an embodiment, the features formed are trench features. The formation of the trench features may use dry etch, plasma etch, and/or other suitable techniques. The patterned photoresist layer may be stripped from the substrate after formation of the features. The features may be substantially similar to the features 110 of the method 100, described above with reference to FIG. 1. Referring to the example of FIG. 9, illustrated are features 902 (e.g., trench features) formed on the substrate 402. The trench features 902 may be etched using the photoresist 802 as a masking element.

The method 300 may continue to include other processes such as, for example, stripping of the hard mask material. In an embodiment, the features 902 and/or 702 are used to define shallow trench isolation regions (STI) of a semiconductor device. In another embodiment, the features 902 and/or 702 are used to define interconnect structures, such as in a back-end-of the line (BEOL) semiconductor processes including, for example, lines, vias, damascene structures, dual-damascene structures and the like.

Referring now to FIG. 10, illustrated is a method 1000 of forming a pattern. The method 1000 may be an embodiment of the method 200, described above with reference to FIG. 2. FIGS. 11-14 are views of an embodiment of a semiconductor device 1100 fabricated according to the method 1000 of FIG. 10.

It is also understood that parts of the semiconductor device 1100 may be fabricated by complementary metal-oxide-semiconductor (CMOS) technology process flow, and thus some processes are only briefly described herein. Further, the semiconductor device 1100 may include various other devices and features, such as additional transistors, bipolar junction transistors, resistors, capacitors, diodes, fuses, etc., but is simplified for a better understanding of the inventive concepts of the present disclosure. The semiconductor device 1100 includes a plurality of semiconductor devices (e.g., transistors), which may be interconnected.

The semiconductor device 1100 may be substantially similar to the device 400, described above with reference to FIGS. 4-9, except as noted below.

The method 1000 begins at block 1002 where a substrate is provided. In an embodiment, the substrate includes a silicon substrate (e.g., a wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate.

The substrate may include any number of layers disposed on a bulk semiconductor layer including conductive layers and insulating layers. The substrate may further include features formed on and/or in the substrate such as, doped regions, gate structures, isolation structures, active regions, and/or other suitable features typical in semiconductor devices and/or processes.

The substrate may include a target layer, which is to be patterned using the method 300. In an embodiment, the substrate itself is the "target layer" to be patterned (e.g., etched). Exemplary target layers include silicon, phosphosilicate glass (PSG) boro-silicate glass (BSG), fluorinated silicon glass (FGS), low-k dielectric materials, undoped silicate glass (USG), tetraethylorthosilicate (TEOS) oxide, other interlayer (or inter-metal) dielectric (ILD) material; and/or other suitable materials. In an embodiment, the target layer is deposited by a chemical vapor deposition (CVD) processes such as plasma-enhanced CVD (PECVD) process, atomic layer deposition (ALD), spin-on coating, physical vapor deposition (PVD), and/or other suitable deposition techniques.

A hard mask layer is formed on the substrate. A hard mask layer may include silicon oxide, silicon nitride, silicon oxynitride, silicon, titanium nitride, titanium, and/or other suitable hard mask material. The hard mask layer(s) may be formed by CVD, ALD, PVD, and/or other suitable deposition techniques. The hard mask layers may be used to form a masking element to provide a pattern or transfer a pattern to the underlying target layer.

Figure 11:
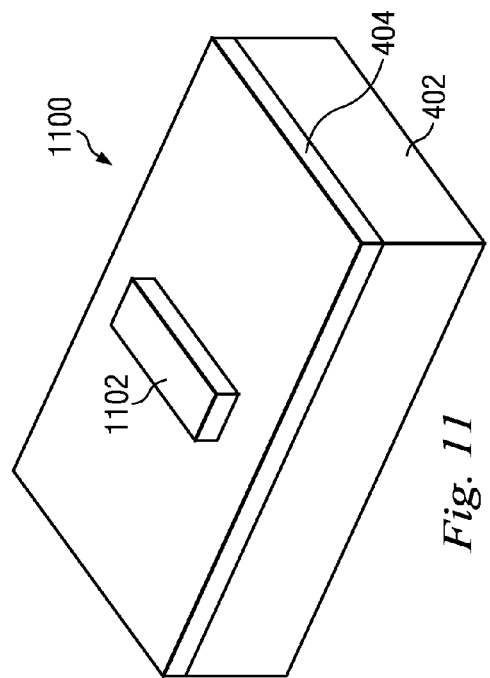
FIGS. 11-14 are cross-sectional views of an embodiment of a semiconductor device fabricated corresponding to steps of the method of FIG. 10.
Figure 12:
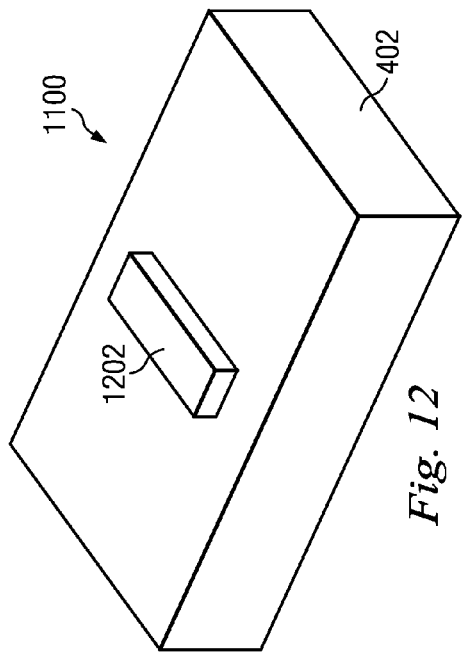

Referring to the example of FIG. 11, a semiconductor device 1100 that includes a substrate 402 having a hard mask layer 404 disposed thereon. The substrate 402 may include a semiconductor (e.g., silicon) substrate. In embodiments, the substrate 402 may include any plurality of layers of material including conductive layers and isolating layers. Additionally, the substrate 402 may include any number of features and/or device such as gate structures, interconnect structures, active regions, source/drain regions, isolation structures, p-wells, n-wells, and/or other features typical of semiconductor devices. The hard mask layer 404 may include hard mask materials such as, for example, silicon oxide, silicon nitride, silicon oxynitride, silicon, titanium nitride, titanium, and/or other suitable hard mask material The method 1000 then proceeds to block 1002 where a masking element is formed on the substrate. The masking element overlies (e.g., protects) an end-to-end spacing area between features that are to be patterned on the substrate. The masking element may be hard mask material. The end-to-end spacing area may be substantially similar to the end-to-end spacing area 108 of the pattern 100, described above with reference to FIG. 1.

In an embodiment, the masking element is provided by forming a layer of photosensitive material (e.g., photoresist or resist) on the substrate, including on the hard mask layer. The layer of photoresist may be provided, for example, by spin-on coating followed by a bake process. The photoresist is patterned using suitable lithography techniques. In an embodiment, the lithography methods include exposing the photoresist to a pattern (using a suitable radiation source), developing the exposed photoresist, baking process(es), cleaning process(es) and/or other suitable CMOS processing methods. Referring to the example of FIG. 12, a photoresist element 1102 is disposed on the hard mask layer 404.

The photoresist element may then be used to form a masking element of the underlying hard mask material. Subsequent to patterning the underlying hard mask material, the photoresist may be stripped from the substrate. Referring to the example of FIG. 12, the photoresist element 1102 (FIG. 11) was used to pattern the hard mask layer 404 (FIG. 11) to form masking element 1202. The masking element 1202 may include hard mask material. Exemplary hard mask materials include silicon oxide, silicon nitride, silicon oxynitride, silicon, titanium nitride, titanium, and/or other suitable hard mask material. In an embodiment, the masking element 1202 has a width of approximately 50 nm and/or a length of approximately 200 nm, by way of example. It is noted that masking element 1202 may be longer than masking element 502 of the embodiment of the device 400, described above with reference to FIG. 5.

The etching of the hard mask material may include dry etching (e.g., reactive ion etching, sputtering, vapor phase etching), plasma etching, and/or other suitable etching processes. The etching may provide a pattern, defined by the masking element, to the hard mask layer.

After forming the masking element, the method 1000 proceeds to block 1006 where a cut process is performed on the masking element, described above with reference to block 1004. Specifically, an etching process is performed to decrease (or "cut") the size of the masking element. The etching of the hard mask material may include dry etching (e.g., reactive ion etching, sputtering, vapor phase etching), plasma etching, and/or other suitable etching processes.

The cut process includes providing a photoresist layer to define the dimensions of the masking element to be formed in the hard mask material. The photoresist layer may be formed by spin-on coating followed by a bake process. The photoresist is patterned using suitable lithography techniques. In an embodiment, the lithography methods include exposing the photoresist to a pattern (using a suitable radiation source), developing the exposed photoresist, baking process(s), cleaning process(es) and/or other suitable CMOS processing methods. The patterned photoresist is then used as a masking element to reduce at least one dimension of the masking element defining the end-to-end spacing. In an embodiment, the cut process is used to define an end-to-end spacing that is less than that of the embodiment of the method 300.

Figure 14:
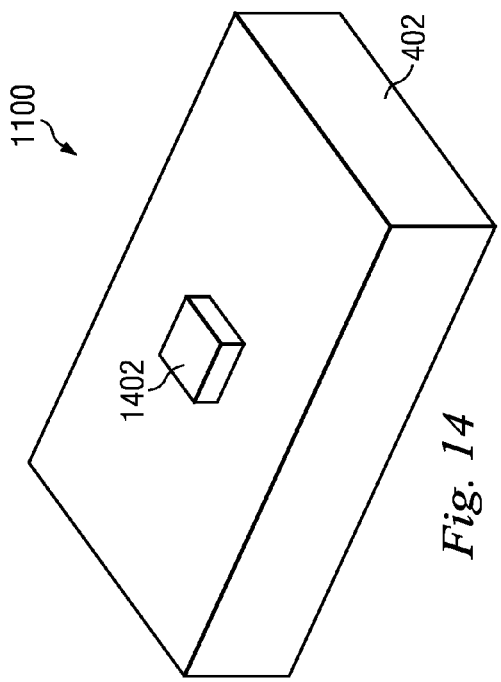
Figure 13A:
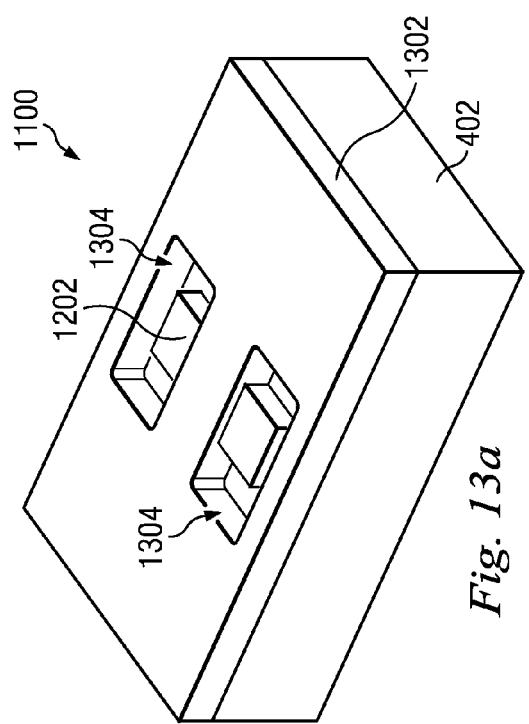
Figure 13B:
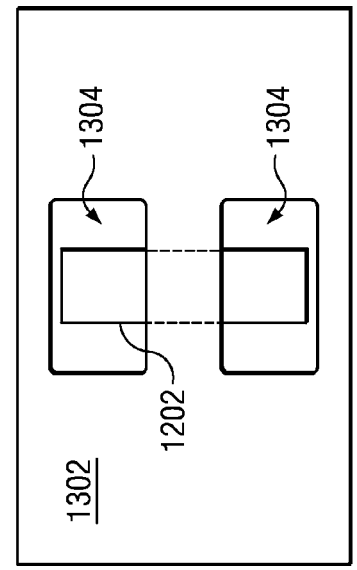

Referring to the example of FIGS. 13a and 13b, a patterned photoresist layer 1302 is disposed on the substrate 402. The patterned photoresist layer 1302 includes openings 1304. The openings 1304 expose end-regions of the masking element 1202. The uncovered end-regions may be removed by a suitable etching process (e.g., wet etch, dry etch, plasma etch, and/or other suitable etching process) thus reducing the length of the masking element. Referring to FIG. 14, illustrated is a masking element 1402, which is the masking element 1102 after etching according to the patterned photoresist layer 1302. It is noted that the device 1100 of FIG. 14 is substantially similar to that the device 400 illustrated in FIG. 5 and masking element 1402 substantially similar to masking element 502.

The method 1000 then continues to fabricate features having end-to-end spacing requirements and features having no end-to-end spacing requirements substantially similarly as described above with reference to the method 300 of FIG. 3. For example, in an embodiment, the method 1000 continues from block 1006 to block 306 of the method 300, described above with reference to FIG. 3. Description of the following process steps are not repeated herein, but referenced made to the above describe of the method 300.

The method 1000 may have advantages over the method 300 in that the masking element defining the end-to-end spacing as originally formed is larger (e.g., element 1102 in comparison to element 502). This may reduce the risk of pattern collapse. However, the method 1000 requires additional photo and etching steps that may have cost and cycle time impacts on the process.

Referring now to FIG. 15, illustrated is a method 1500 of forming a pattern. The method 1500 may be yet another embodiment of the method 200, described above with reference to FIG. 2. FIGS. 16-22 are views of an embodiment of a semiconductor device 1600 fabricated according to the method 1500 of FIG. 15.

It is also understood that parts of the semiconductor device 1600 may be fabricated by complementary metal-oxide-semiconductor (CMOS) technology process flow, and thus some processes are only briefly described herein. Further, the semiconductor device 1600 may include various other devices and features, such as additional transistors, bipolar junction transistors, resistors, capacitors, diodes, fuses, etc., but is simplified for a better understanding of the inventive concepts of the present disclosure. The semiconductor device 1600 includes a plurality of semiconductor devices (e.g., transistors), which may be interconnected.

The method 1500 begins at block 1502 where a substrate is provided. In an embodiment, the substrate includes a silicon substrate (e.g., a wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate.

The substrate may include any number of layers disposed on a bulk semiconductor layer including conductive layers and insulating layers. The substrate may further include features formed on and/or in the substrate such as, doped regions, gate structures, isolation structures, active regions, and/or other suitable features typical in semiconductor devices and/or processes.

The substrate may include a target layer, which is to be patterned using the method 1500. In an embodiment, the substrate itself is the "target layer" to be patterned (e.g., etched). Exemplary target layers include silicon, phosphosilicate glass (PSG) boro-silicate glass (BSG), fluorinated silicon glass (FGS), low-k dielectric materials, undoped silicate glass (USG), tetraethylorthosilicate (TEOS) oxide, other inter-layer (or inter-metal) dielectric (ILD) material; and/or other suitable materials. In an embodiment, the target layer is deposited by a chemical vapor deposition (CVD) processes such as plasma-enhanced CVD (PECVD) process, atomic layer deposition (ALD), spin-on coating, physical vapor deposition (PVD), and/or other suitable deposition techniques.

A hard mask layer is formed on the substrate. A hard mask layer may include silicon oxide, silicon nitride, silicon oxynitride, silicon, titanium nitride, titanium, and/or other suitable hard mask material. The hard mask layer(s) may be formed by CVD, ALD, PVD, and/or other suitable deposition techniques. The hard mask layers may be used to form a pattern or transfer a pattern to the underlying target layer.

Figure 16:
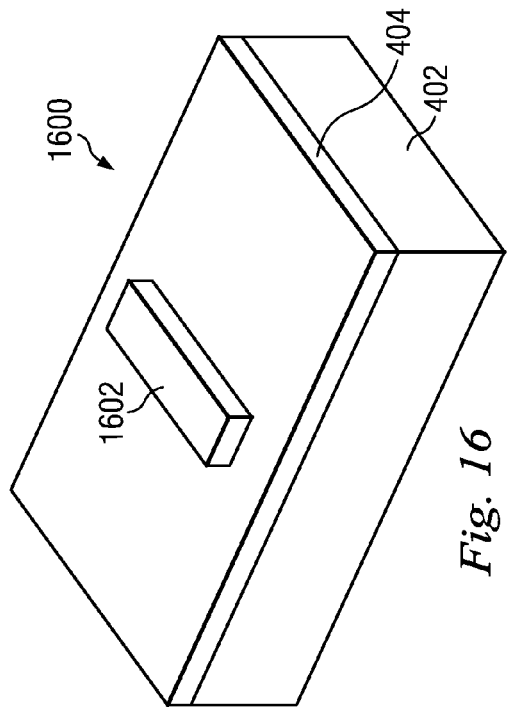
Figure 17:
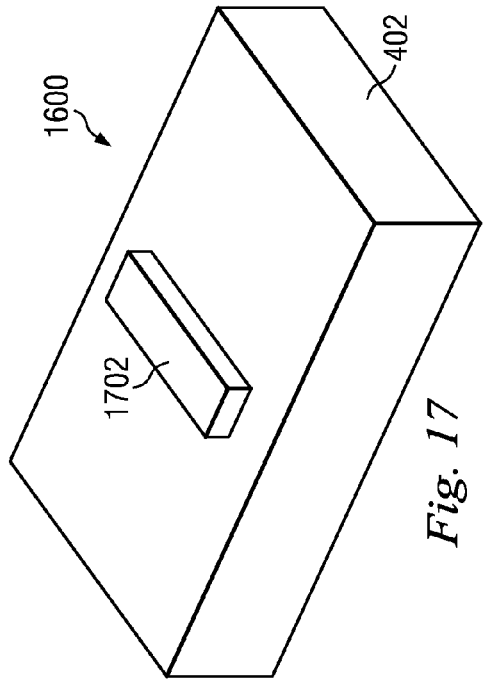

Referring to the example of FIG. 16, a semiconductor device 1600 that includes a substrate 402 having a hard mask layer 404 disposed thereon. The substrate 402 may include a semiconductor (e.g., silicon) substrate. In embodiments, the substrate 402 may include any plurality of layers of material including conductive layers and isolating layers. Additionally, the substrate 402 may include any number of features and/or device such as gate structures, interconnect structures, active regions, source/drain regions, isolation structures, p-wells, n-wells, and/or other features typical of semiconductor devices.

The method 1500 then proceeds to block 1504 where a masking element is formed on the substrate. The masking element overlies (e.g., protects) an end-to-end spacing area between features that are to be patterned on the substrate. The masking element may be hard mask material.

In an embodiment, the masking element is formed by forming a layer of photosensitive material (e.g., photoresist or resist) on the substrate, including on the hard mask layer. The layer of photoresist may be provided, for example, by spin-on coating followed by a bake process. The photoresist is patterned using suitable lithography techniques. In an embodiment, the lithography methods include exposing the photoresist to a pattern (using a suitable radiation source), developing the exposed photoresist, baking process(es), cleaning process(es) and/or other suitable CMOS processing methods. Referring to the example of FIG. 16, a photoresist element 1602 is disposed on the hard mask layer 404.

The photoresist element may then be used to form a masking element of the underlying hard mask material. Subsequent to patterning the underlying material, the photoresist may be stripped from the substrate. Referring to the example of FIG. 17, the photoresist element 1602 (FIG. 16) was used to pattern the hard mask layer 404 (FIG. 16) to form masking element 1702. The masking element 1702 may include hard mask material. Exemplary hard mask materials include silicon oxide, silicon nitride, silicon oxynitride, silicon, titanium nitride, titanium, and/or other suitable hard mask material. In an embodiment, the masking element 1702 has a width of approximately 50 nm and/or a length of approximately 200 nm, by way of example.

The etching of the hard mask material may include dry etching (e.g., reactive ion etching, sputtering, vapor phase etching), plasma etching, and/or other suitable etching processes.

After forming the masking element, the method 1500 proceeds to block 1506 where a patterned photoresist layer is formed. The photoresist layer of block 1506 may be separate and distinct from any photoresist layer used to form the masking element described above with reference to block 1504 (e.g., a different photomask may be used). The photoresist layer may be formed by spin-on coating followed by a bake process. The photoresist is patterned using suitable lithography techniques. In an embodiment, the lithography methods include exposing the photoresist to a pattern (using a suitable radiation source), developing the exposed photoresist, baking process(s), cleaning process(es) and/or other suitable CMOS processing methods. Referring to the example of FIGS. 18a and 18b, a patterned photoresist layer 1802 is disposed on the substrate 402. The patterned photoresist layer 1802 includes an opening 1804.

The method 1500 then proceeds to block 1508 where features having an end-to-end spacing requirement are formed using the patterned photoresist layer of block 1506. In an embodiment, the features formed are trench features having an end-to-end spacing region between the trench features. The formation of the trench features may use dry etch, plasma etch, and/or other suitable techniques. The end-to-end spacing region may be substantially similar to the end-to-end spacing 108, described above with respect to the pattern 100 of FIG. 1. The patterned photoresist layer may be stripped from the substrate after formation of the features.

Figure 19:
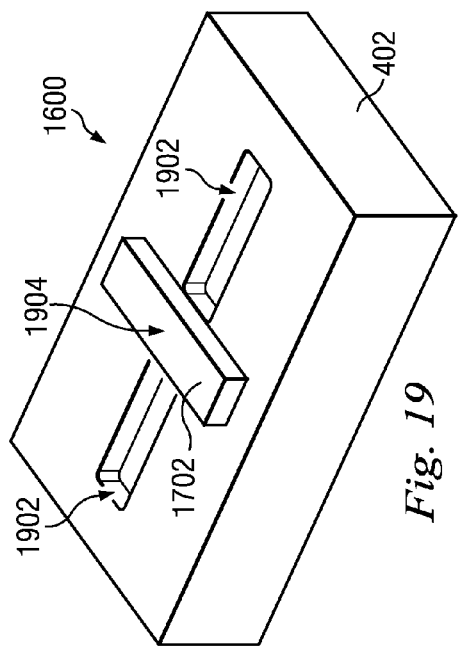

Referring to the example of FIG. 19, illustrated are features 1902 (e.g., trench features) formed on and substrate 402. The trench features 1902 may be etched using the photoresist 1802 and masking element 1702 (e.g., hard mask) as masking elements. The trench features 1902 are spaced a distance from one another. Specifically, the region 1904 interposes the trench features 1902. The region 1904 may be referred to as an end-to-end spacing. The region 1904 may be substantially similar to the end-to-end spacing 108, described above with respect to the pattern 100 of FIG. 1. The trench features 1902 may be substantially similar to the features 106, described above with reference to FIG. 1. It is noted that the region 1904 is protected during the etching process by the masking element 1702.

Figure 20A:
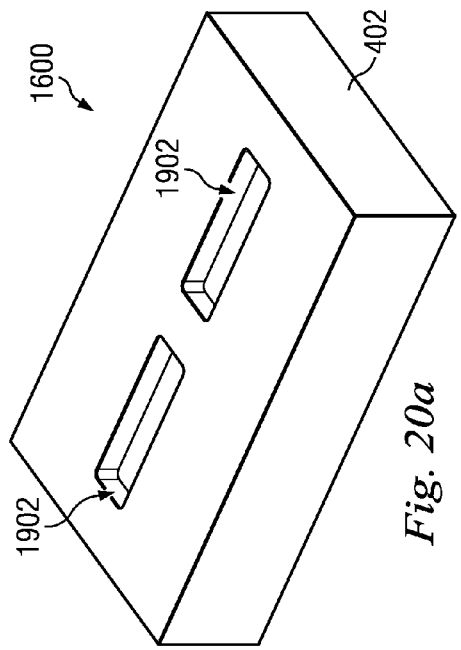
Figure 18A:
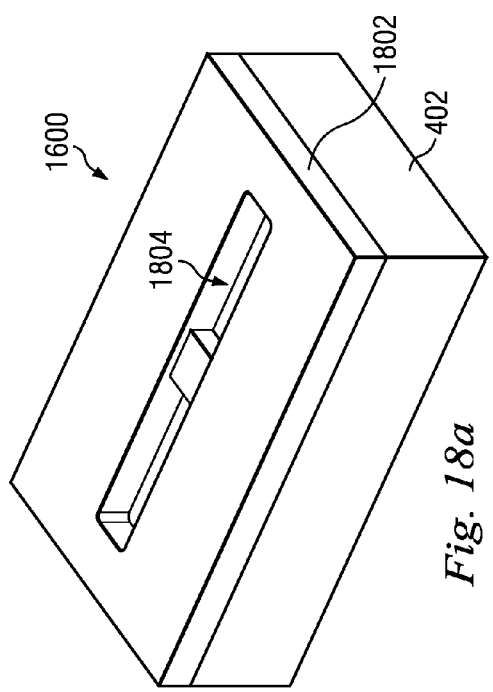
Figure 18B:
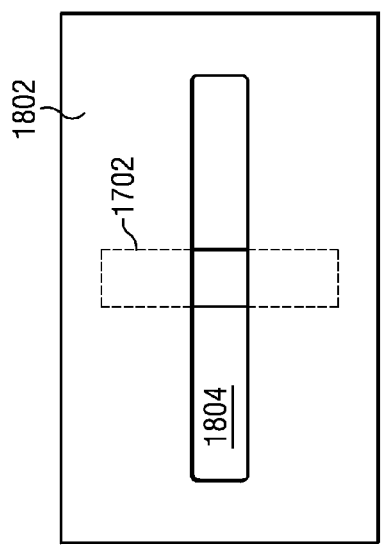

After forming the features having an end-to-end spacing requirement, the method 1500 proceeds to block 1510 where the masking element described above with reference to block 1504 (e.g., defining the end-to-end spacing) is removed from the substrate. The masking element may be removed by suitable etching and/or stripping processes. Referring to the example of FIGS. 20a and 20b, the masking element 1702 (FIGS. 17-19) has been removed from the substrate 402. (The top view of FIG. 20b, 21b illustrates the outline 2000 of masking element 1702 for reference only and not intending to indicate its presence on the substrate.) It is noted that the method 1500 may be used to form features, such as 2202, described below that are closer in distance than the similarly configured features of the method 300 because the masking element length does not constrain the distance between their formation.

The method 1500 then proceeds to block 1512 where another patterned photoresist layer is formed. The photoresist layer of block 1512 may be separate and distinct from any photoresist layer used to form the masking element described above with reference to block 1504 and different from that of block 1506 (e.g., a different photomask may be used). The photoresist layer may be formed by spin-on coating followed by a bake process. The photoresist is patterned using suitable lithography techniques. In an embodiment, the lithography methods include exposing the photoresist to a pattern (using a suitable radiation source), developing the exposed photoresist, baking process(s), cleaning process(es) and/or other suitable CMOS processing methods. Referring to the example of FIGS. 21a and 21b, a patterned photoresist layer 2102 is disposed on the substrate 402. The patterned photoresist layer 2102 includes openings 2104. The openings 2104 may define features to formed on/in the substrate 402 (e.g., trenches 2202, described below).

The method 1500 then proceeds to block 1514 where features (e.g., not having an end-to-end spacing requirement) are formed using the patterned photoresist layer of block 1512. In an embodiment, the features are substantially similar to the features 110 of the pattern 100, described above with reference to FIG. 1. In an embodiment, the features formed are trench features. The formation of the trench features may use dry etch, plasma etch, and/or other suitable techniques. The patterned photoresist layer may be stripped from the substrate after formation of the features. Referring to the example of FIG. 22, illustrated are trench features 2202 formed on the substrate 402. The trench features 2202 may be etched using the photoresist 2102 as a masking element.

The method 1500 may continue to include other processes such as, for example, stripping of the hard mask material. In an embodiment, the features 1902 and/or 2202 are used to define shallow trench isolation regions (STI) of a semiconductor device. In another embodiment, the trench features 1902 and/or 2202 are used to define interconnect structures, such as in a back-end-of the line (BEOL) semiconductor process including, for example, lines, vias, damascene structures, dual-damascene structures and the like.

In summary, the methods and devices disclosed herein provide for methods of fabricating a pattern on a substrate having an end-to-end space between adjacent features. In doing so, the present disclosure offers several advantages over prior art devices. Advantages of embodiments of the present disclosure include providing a small end-to-end space that is defined and/or protected (e.g., from collapse) by a masking element (e.g., hard mask) feature. Such methods maybe used at various stages in a semiconductor fabrication process including in the front-end-of-the-line processing (FEOL) and back-end-of-the-line (BEOL) processing. Exemplary process steps include, but are not limited to, shallow trench isolation (STI) feature and damascene (e.g., copper damascene interconnect) features. It is understood that different embodiments disclosed herein offer different disclosure, and that they may make various changes, substitutions and alterations herein without departing from the spirit and scope of the present disclosure.

Thus, provided in an embodiment is a method of fabricating a semiconductor device, which includes forming a masking element on a semiconductor substrate. The masking element overlies a space. A first feature having a first end and a second end is formed on the semiconductor substrate. A second feature also having a first end and a second end is also formed on the substrate. The space interposes the first and second features and extends from the first end of the first feature to the first end of the second feature the first feature and the second feature. A third feature is then formed adjacent and substantially parallel the first and second features. The third feature extends at least from the first end of the first feature to the first end of the second feature.

In another embodiment described, a method includes forming a hard mask masking element on a substrate and forming a first patterned photoresist layer on the substrate and overlying a portion of the hard mask masking element. First and second trenches are etched in the substrate (e.g., a semiconductor base substrate or any overlying layer) using the first patterned photoresist layer and the hard mask masking element as masking elements during the etching. Then, a second patterned photoresist layer is formed on the substrate after etching the first and second trenches. The second patterned photoresist layer also overlies the hard mask masking element. A third and a fourth trench are etched in the substrate using the second patterned photoresist layer as a masking element during the etching.

In yet another embodiment, a method is described that includes providing a substrate having a hard mask layer. A hard mask masking element is formed of the hard mask layer, the element overlying an end-to-end space region. A first feature is disposed on a first side of the end-to-end space region and a second feature is disposed on a second side of the end-to-end space region. After forming the first and second features, the hard mask masking element is removed. Then, a third and fourth feature are formed and disposed substantially parallel to and a distance from the first and second features.

What is claimed is:

1. A method of fabricating a semiconductor device, comprising:
   forming a masking element on a semiconductor substrate, wherein the masking element overlies a space region;
   forming a first feature having a first end and a second end on the semiconductor substrate;
   forming a second feature having a first end and a second end, wherein the space region interposes the first and second features and extends from the first end of the first feature to the first end of the second feature; and
   subsequent to forming at least one of the first and second features, forming a third feature adjacent and substantially parallel the first and second features and alongside the space region, wherein the third feature extends at least a first length, wherein the first length is greater than the distance from the first end of the first feature to the first end of the second feature.

2. The method of claim 1, wherein the third feature extends from the second end of the first feature to the second end of the second feature.

3. The method of claim 1, wherein the masking element is formed of hard mask material.

4. The method of claim 1, wherein the forming the first feature and the forming second feature are performed substantially simultaneously.

5. The method of claim 1, wherein the forming the first feature and the forming second feature includes:
  forming a first patterned photoresist layer; and
  etching a first trench and a second trench using the first patterned photoresist layer,
  wherein the first trench provides the first feature and the second trench provides the second feature.

6. The method of claim 1, wherein the forming the third feature includes:
  forming a patterned photoresist layer; and
  etching a third trench using the patterned photoresist layer, wherein the third trench provides the third feature.

7. The method of claim 1, wherein the first, second and third features are each a portion of an interconnect of the semiconductor device.

8. The method of claim 1, wherein the first, second and third features are each shallow trench isolation features of the semiconductor device.

9. A method, comprising:
  forming a hard mask masking element on a substrate;
  forming a first patterned photoresist layer on the substrate and overlying a portion of the hard mask masking element;
  etching first and second trenches in the substrate using the first patterned photoresist layer and the hard mask masking element as masking elements during the etching;
  forming a second patterned photoresist layer on the substrate after etching the first and second trenches, wherein the second patterned photoresist layer overlies the hard mask masking element; and
  etching a third and a fourth trench in the substrate using the second patterned photoresist layer as a masking element during the etching.

10. The method of claim 9, wherein the hard mask masking element is disposed between the first and second trenches.

11. The method of claim 9, wherein the etching the first, second, third, and fourth trenches includes etching a dielectric layer of the substrate.

12. The method of claim 9, wherein the forming the hard mask masking element includes:
  providing the substrate having a hard mask layer formed on the substrate;
  patterning the hard mask layer to form an elongated hard mask masking element; and
  performing a cut process on the elongated hard mask masking element to form the hard mask masking element.

13. The method of claim 12, wherein the performing the cut process includes:
  depositing a photoresist layer on the substrate; and
  using the photoresist layer as a masking element while etching the elongated hard mask layer, wherein the etching the elongated hard mask layer reduces a length of the elongated hard mask masking element to from the hard mask masking element.

14. The method of claim 9, wherein the etching the first and second trenches in the substrate includes providing the first trench with a first edge and the second trench with a second edge, and wherein the hard mask masking element extends from the first edge to the second edge.

15. The method of claim 9, wherein the etching the third and fourth trenches include disposing the third feature substantially parallel to the first and second features and on a first side of the first and second features and disposing the fourth feature substantially parallel to the first and second features and on a second side of the first and second features, the second side opposing the first side.

16. The method of claim 9, wherein the first, second, third and fourth features are at least one of a shallow trench isolation feature and an interconnect feature.

17. A method, comprising:
  providing a substrate;
  forming a masking element overlying an end-to-end space region;
  forming a first feature on a first side of the end-to-end space region and a second feature on a second side of the end-to-end space region;
  removing the masking element after forming the first and second features; and
  after removing the masking element, forming a third and fourth feature disposed substantially parallel to and spaced a distance from the first and second features.

18. The method of claim 17, wherein the forming the first and second features include forming first and second shallow trench isolation features.

19. The method of claim 17, wherein the forming the first and second features include forming first and second interconnect features.

20. The method of claim 17, wherein the end-to-end space region extends from an edge of the first feature to an edge of the second feature.

* * * * *